(12) United States Patent
Dawson, Sr.

(10) Patent No.: US 11,485,344 B1
(45) Date of Patent: Nov. 1, 2022

(54) ANTI-SKID BRAKING SYSTEM DIAGNOSTIC TOOL

(71) Applicant: Robert Dawson, Sr., Windsor Mill, MD (US)

(72) Inventor: Robert Dawson, Sr., Windsor Mill, MD (US)

( * ) Notice: Subject to any disclaimer, the term of this patent is extended or adjusted under 35 U.S.C. 154(b) by 394 days.

(21) Appl. No.: 16/787,131

(22) Filed: Feb. 11, 2020

(51) Int. Cl.
*B60T 17/22* (2006.01)
*G01L 5/28* (2006.01)
*G01R 31/00* (2006.01)
*B60T 8/90* (2006.01)

(52) U.S. Cl.
CPC .............. *B60T 17/221* (2013.01); *B60T 8/90* (2013.01); *G01L 5/282* (2013.01); *G01R 31/006* (2013.01)

(58) Field of Classification Search
CPC .......... B60T 8/90; B60T 17/221; G01L 5/282; G01R 31/006
See application file for complete search history.

(56) References Cited

U.S. PATENT DOCUMENTS

| | | | | |
|---|---|---|---|---|
| 4,700,304 A | * | 10/1987 | Byrne | B60T 8/885 701/76 |
| 4,719,796 A | * | 1/1988 | Zenker | B60T 8/90 73/121 |
| 4,771,387 A | * | 9/1988 | Hexel | B60T 8/88 701/76 |
| 4,831,560 A | | 5/1989 | Zaleski | |
| 4,831,868 A | * | 5/1989 | Makino | G01L 5/282 73/114.61 |
| 5,005,405 A | * | 4/1991 | Ishizeki | B60T 17/22 73/123 |
| 5,176,429 A | * | 1/1993 | Junichi | B60T 8/885 303/DIG. 9 |
| 5,221,127 A | * | 6/1993 | Ehmer | B60T 8/885 180/197 |
| 5,493,495 A | * | 2/1996 | Naito | B60T 8/885 701/76 |
| 5,557,523 A | * | 9/1996 | Yeh | B60T 8/885 701/32.8 |
| 5,621,168 A | * | 4/1997 | Kim | G01L 5/282 73/123 |
| 5,941,612 A | | 8/1999 | Carpenter | |
| 6,188,948 B1 | | 2/2001 | Shivler, Jr. | |
| 6,256,572 B1 | | 7/2001 | Rea | |
| D792,407 S | | 7/2017 | Fitch | |
| 2021/0190846 A1 | * | 6/2021 | Gendelman | B60T 17/22 |

* cited by examiner

*Primary Examiner* — Eric S. McCall
(74) *Attorney, Agent, or Firm* — Kyle A. Fletcher, Esq.

(57) ABSTRACT

The ABS diagnostic tool is an electrical apparatus. The ABS diagnostic tool is configured for use with a vehicle. The vehicle further comprises an anti-skid braking system (ABS). The ABS forms the brake system of the vehicle. The ABS diagnostic tool is an interface device that electrically connects to the ABS. The ABS diagnostic tool provides electrical access to key elements of the ABS that allows for the use of electric tools, such as a multi-meter, in diagnosing maintenance issues associated with the ABS. The ABS diagnostic tool comprises a breakout circuit and the vehicle. The breakout circuit plugs into the ABS. The interface presented by the breakout circuits presents a plurality of terminal sets which are electrically accessible.

17 Claims, 4 Drawing Sheets

ANTI-SKID BRAKING SYSTEM DIAGNOSTIC TOOL

CROSS REFERENCES TO RELATED APPLICATIONS

Not Applicable

STATEMENT REGARDING FEDERALLY SPONSORED RESEARCH

Not Applicable

REFERENCE TO APPENDIX

Not Applicable

BACKGROUND OF THE INVENTION

Field of the Invention

The present invention relates to the field of transportation and vehicles including brake control systems, more specifically, an arrangement for adjusting wheel braking force in response to driving conditions and associated testing equipment.

SUMMARY OF INVENTION

The ABS diagnostic tool is an electrical apparatus. The ABS diagnostic tool is configured for use with a vehicle. The vehicle further comprises an anti-skid braking system (ABS). The ABS forms the brake system of the vehicle. The ABS diagnostic tool is an interface device that electrically connects to the ABS. The ABS diagnostic tool provides electrical access to key elements of the ABS that allows for the use of electrical tools, such as a multi-meter, in diagnosing maintenance issues associated with the ABS. The ABS diagnostic tool comprises a breakout circuit and the vehicle. The breakout circuit plugs into the ABS. The interface presented by the breakout circuits presents a plurality of terminal sets which are electrically accessible.

These together with additional objects, features and advantages of the ABS diagnostic tool will be readily apparent to those of ordinary skill in the art upon reading the following detailed description of the presently preferred, but nonetheless illustrative, embodiments when taken in conjunction with the accompanying drawings.

In this respect, before explaining the current embodiments of the ABS diagnostic tool in detail, it is to be understood that the ABS diagnostic tool is not limited in its applications to the details of construction and arrangements of the components set forth in the following description or illustration. Those skilled in the art will appreciate that the concept of this disclosure may be readily utilized as a basis for the design of other structures, methods, and systems for carrying out the several purposes of the ABS diagnostic tool.

It is therefore important that the claims be regarded as including such equivalent construction insofar as they do not depart from the spirit and scope of the ABS diagnostic tool. It is also to be understood that the phraseology and terminology employed herein are for purposes of description and should not be regarded as limiting.

BRIEF DESCRIPTION OF DRAWINGS

The accompanying drawings, which are included to provide a further understanding of the invention are incorporated in and constitute a part of this specification, illustrate an embodiment of the invention and together with the description serve to explain the principles of the invention. They are meant to be exemplary illustrations provided to enable persons skilled in the art to practice the disclosure and are not intended to limit the scope of the appended claims.

DETAILED DESCRIPTION OF THE EMBODIMENT

The following detailed description is merely exemplary in nature and is not intended to limit the described embodiments of the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims. Furthermore, there is no intention to be bound by any expressed or implied theory presented in the preceding technical field, background, brief summary or the following detailed description.

Figure 1:
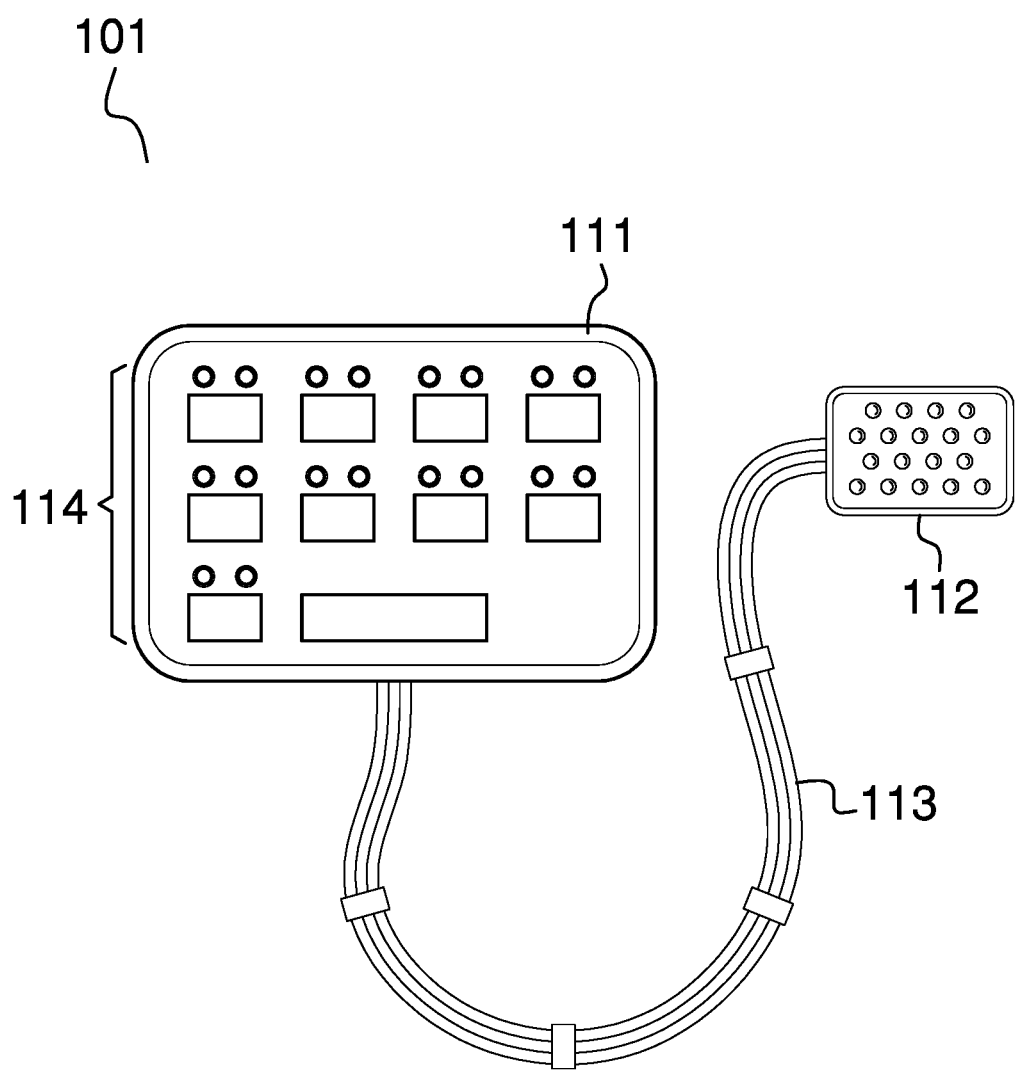
FIG. 1 is a front view of an embodiment of the disclosure.
Figure 2:
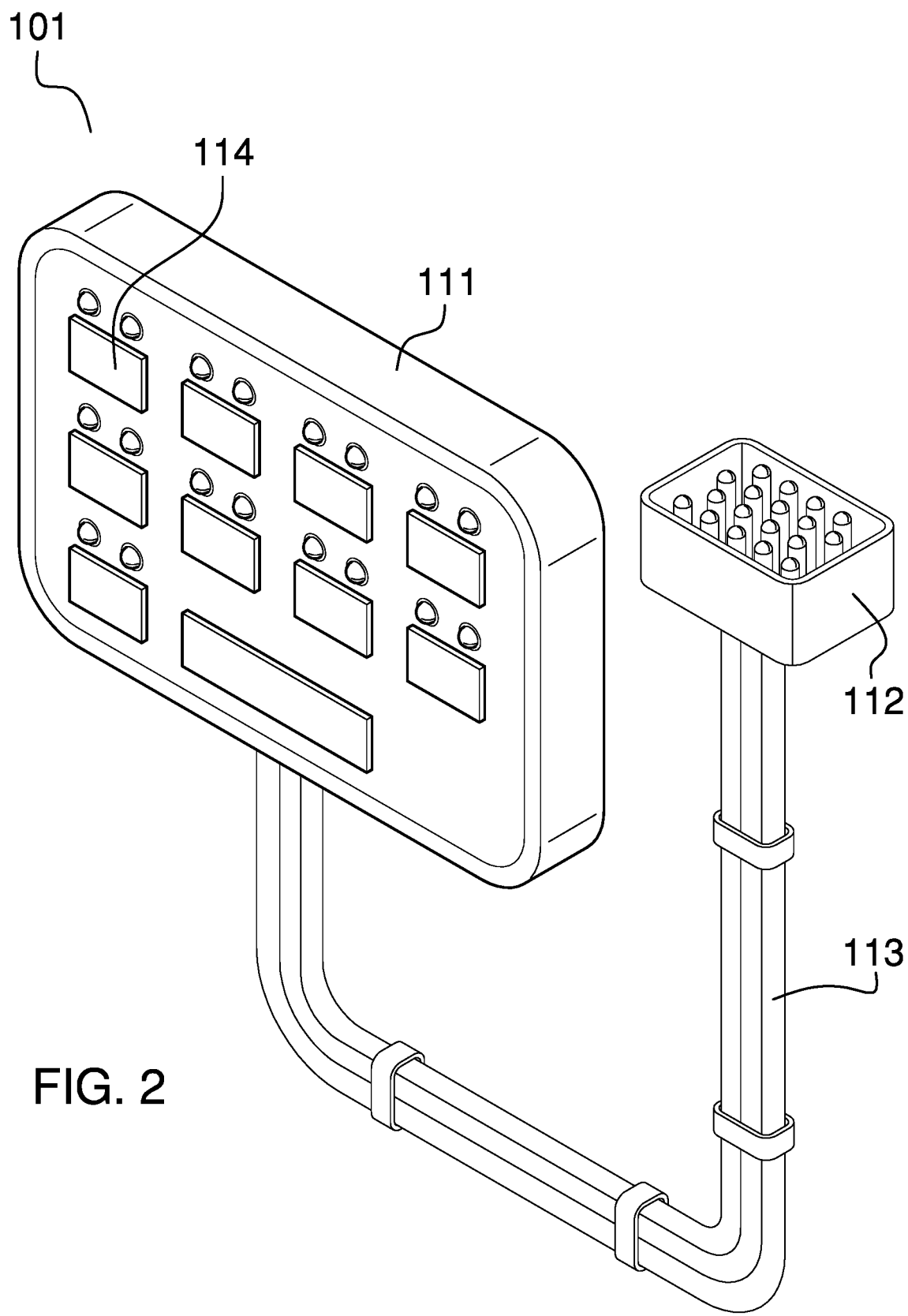
FIG. 2 is a perspective view of an embodiment of the disclosure.
Figure 3:
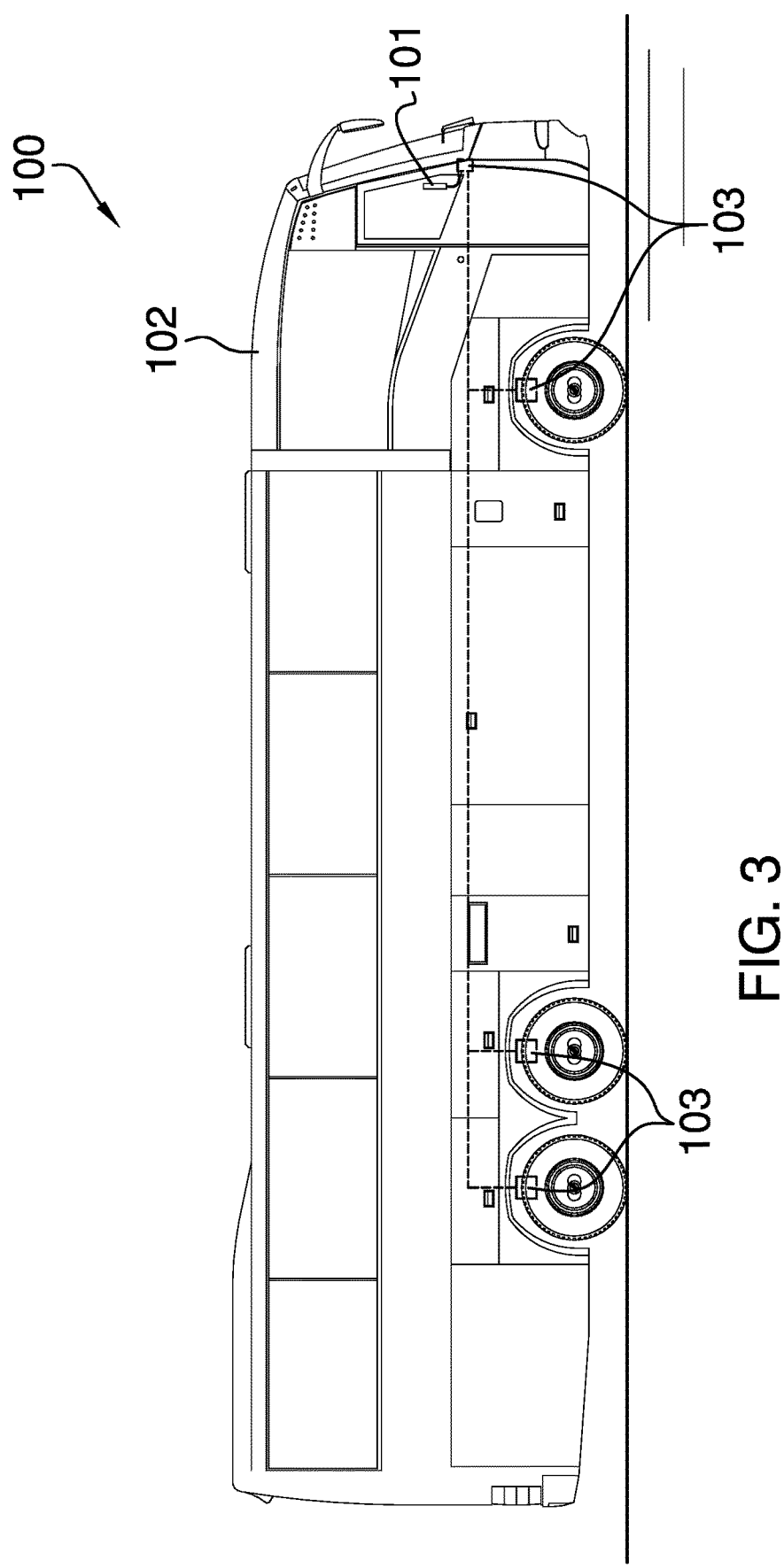
FIG. 3 is an in-use view of an embodiment of the disclosure.
Figure 4:
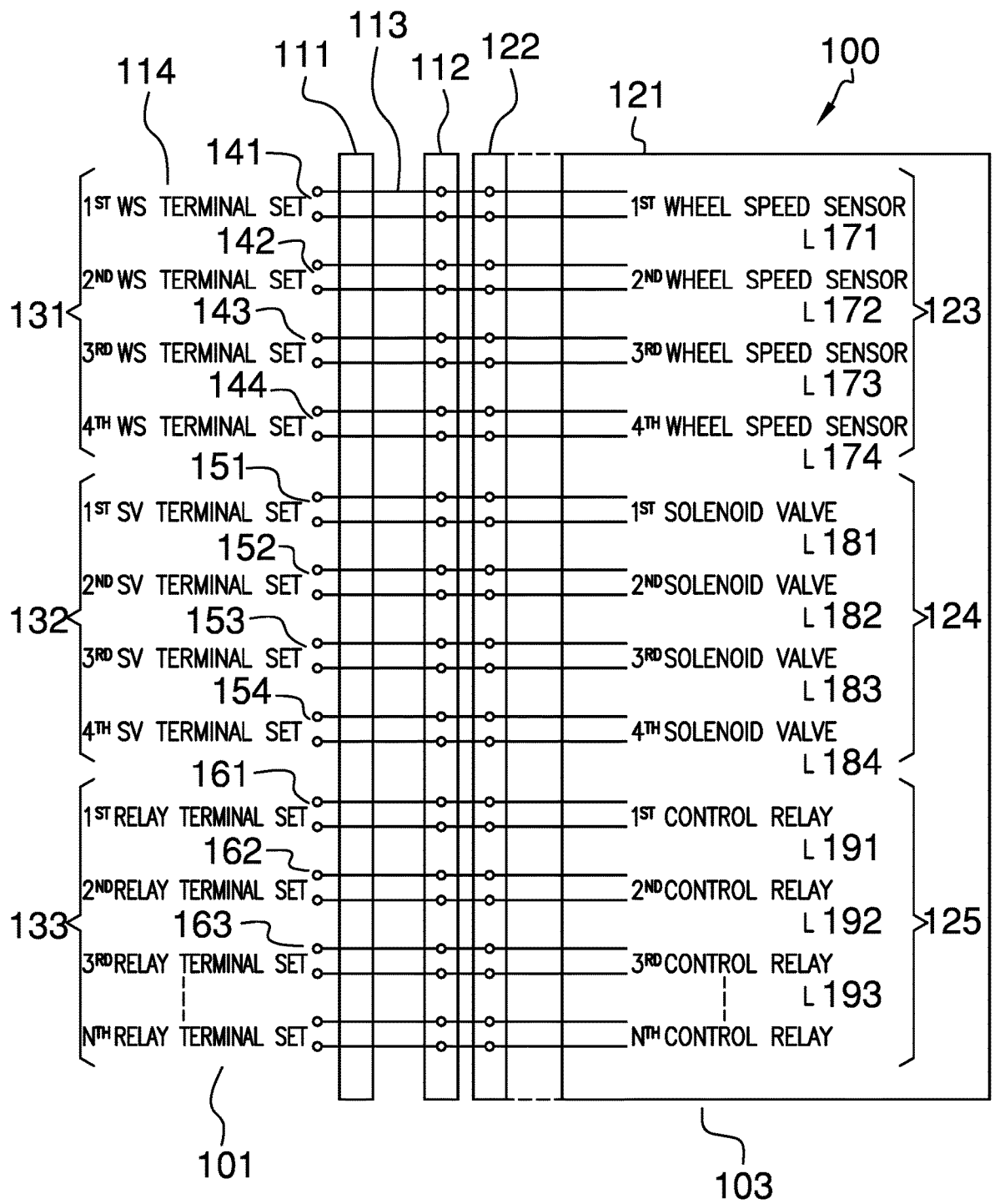
FIG. 4 is a block diagram or schematic view of an embodiment of the disclosure.

Detailed reference will now be made to one or more potential embodiments of the disclosure, which are illustrated in FIGS. 1 through 4.

The ABS diagnostic tool 100 (hereinafter invention) is an electrical apparatus. The invention 100 is configured for use with a vehicle 102. The vehicle 102 further comprises an anti-skid braking system 103 (ABS). The ABS 103 forms the brake system of the vehicle 102. The invention 100 is an interface device that electrically connects to the ABS 103. The invention 100 provides electrical access to key elements of the ABS 103 that allows for the use of electric tools, such as a multi-meter, in diagnosing maintenance issues associated with the ABS 103. The invention 100 comprises a breakout circuit 101 and the vehicle 102. The breakout circuit 101 plugs into the ABS 103. The interface presented by the breakout circuit 101 comprises a plurality of terminal sets 114 which provide the electric connections to the key circuits of the ABS 103.

The vehicle 102 is a motorized vehicle 102. The vehicle 102 is defined elsewhere in this disclosure. The vehicle 102 further comprises the ABS 103.

The ABS 103 is the braking system of the vehicle 102. The ABS 103 is an electromechanical device. The ABS 103 measures the speed of rotation of each braked wheel of the vehicle 102. The ABS 103 is a feedback device that adjusts the pressure of the hydraulic fluid applied to each braking element of the ABS 103 based on the speed of rotation of each braked wheel. The terms ABS 103 and braked wheel are defined elsewhere in this disclosure. The ABS 103 comprises an ABS 103 housing 121, a diagnostic port 122, a plurality of wheel sensors 123, a plurality of solenoid valves 124, and a plurality of control relays 125.

The ABS 103 housing 121 is a rigid casing. The ABS 103 housing 121 contains the control elements of the ABS 103. The ABS 103 housing 121 is formed with all apertures and form factors necessary to allow the ABS 103 housing 121 to provide access to the control elements of the ABS 103 from the breakout circuit 101. Methods to form an ABS 103 housing 121 suitable for the purposes described in this disclosure are well-known and documented in the mechanical arts.

The diagnostic port 122 is an electric device. The port is defined elsewhere in this disclosure. The diagnostic port 122 forms a plurality of electrical connections between the breakout circuit 101 and the ABS 103. The diagnostic port 122 electrically connects to the breakout plug 112 of the breakout circuit 101 to the key electrically active elements of the ABS 103. Specifically, the breakout plug 112 inserts into the diagnostic port 122 of the ABS 103 to physically form the electrical connections between the breakout circuit 101 and the ABS 103. The diagnostic port 122 transfers electrical signals between the breakout plug 112 of the breakout circuit 101 and the plurality of wheel sensors 123, the plurality of solenoid valves 124, and the plurality of control relays 125 of the ABS 103.

Each of the plurality of wheel sensors 123 is a sensor. Each of the plurality of wheel sensors 123 measures the speed of rotation of a braked wheel of the vehicle 102. Each of the plurality of wheel sensors 123 electrically connects to the control circuit of the ABS 103 such that the electrical signals generated by the plurality of wheel sensors 123 provide the feedback necessary for the ABS 103 the appropriately adjust the plurality of solenoid valves 124 to provide the appropriate hydraulic fluid pressure to each braked wheel of the ABS 103 during the braking process. The term feedback is defined elsewhere in this disclosure. The plurality of wheel sensors 123 comprises a first wheel sensor 171, a second wheel sensor 172, a third wheel sensor 173, and a fourth wheel sensor 174.

The first wheel sensor 171 is a sensor used to measure the speed of rotation of a first braked wheel of the vehicle 102. The first wheel sensor 171 is monitored by the control circuit of the ABS 103. The second wheel sensor 172 is a sensor used to measure the speed of rotation of a second braked wheel of the vehicle 102. The second wheel sensor 172 is monitored by the control circuit of the ABS 103. The third wheel sensor 173 is a sensor used to measure the speed of rotation of a third braked wheel of the vehicle 102. The third wheel sensor 173 is monitored by the control circuit of the ABS 103. The fourth wheel sensor 174 is a sensor used to measure the speed of rotation of a fourth braked wheel of the vehicle 102. The fourth wheel sensor 174 is monitored by the control circuit of the ABS 103.

Each of the plurality of solenoid valves 124 is an electrically controlled valve. The solenoid valve is defined elsewhere in this disclosure. Each solenoid valve selected from the plurality of solenoid valves 124 controls the hydraulic fluid pressure that is provided to the braking element of a braked wheel associated with the selected solenoid valve. The control circuit of the ABS 103 electrically controls the operation of each of the plurality of solenoid valves 124. Each of the plurality of solenoid valves 124 controls the hydraulic fluid pressure applied by the ABS 103 to a selected braked wheel of the vehicle 102. Each solenoid valve selected from the plurality of solenoid valves 124 electrically connects to the control circuitry of the ABS 103 such that the electrical signals generated by the ABS 103 indicates to the selected solenoid valve the operational setting required to provide the appropriate hydraulic fluid pressure to the brake wheel supported by the selected solenoid valve. The plurality of solenoid valves 124 comprises a first solenoid valve 181, a second solenoid valve 182, a third solenoid valve 183, and a fourth solenoid valve 184.

The first solenoid valve 181 is a solenoid valve that controls the hydraulic fluid pressure provided to the braking element of a first braked wheel of the vehicle 102. The first solenoid valve 181 is controlled using the control circuit of the ABS 103. The second solenoid valve 182 is a solenoid valve that controls the hydraulic fluid pressure provided to the braking element of a second braked wheel of the vehicle 102. The second solenoid valve 182 is controlled using the control circuit of the ABS 103. The third solenoid valve 183 is a solenoid valve that controls the hydraulic fluid pressure provided to the braking element of a third braked wheel of the vehicle 102. The third solenoid valve 183 is controlled using the control circuit of the ABS 103. The fourth solenoid valve 184 is a solenoid valve that controls the hydraulic fluid pressure provided to the braking element of a fourth braked wheel of the vehicle 102. The fourth solenoid valve 184 is controlled using the control circuit of the ABS 103.

Each of the plurality of control relays 125 is an electrically controlled switch. The relay is defined elsewhere in this disclosure. Each of the plurality of control relays 125 physically routes the flow of electricity through the control circuit of the ABS 103 to control the braking operation and performance of the vehicle 102. Each relay selected from the plurality of control relays 125 transmits a control signal used by the control circuit of the ABS 103 to control the braking operation and performance of the ABS 103. The plurality of control relays 125 comprises a first control relay 191, a second control relay 192, and a third control relay 193.

The first control relay 191 is a relay that controls the flow of electricity through the control circuit of the ABS 103. The control circuit of the ABS 103 controls a portion of the operation of the ABS 103 using the first control relay 191. The second control relay 192 is a relay that controls the flow of electricity through the control circuit of the ABS 103. The control circuit of the ABS 103 controls a portion of the operation of the ABS 103 using the second control relay 192. The third control relay 193 is a relay that controls the flow of electricity through the control circuit of the ABS 103. The control circuit of the ABS 103 controls a portion of the operation of the ABS 103 using the third control relay 193.

The breakout circuit 101 is an electrical circuit. The breakout circuit 101 electrically connects to the ABS 103. The ABS 103 electrically connects the breakout circuit 101 to the key electrical elements of the ABS 103 such that the breakout circuit 101 provides electrical connections for tools used to diagnose electrical maintenance issues. The breakout circuit 101 physically presents these electrical connections through a plurality of terminal sets 114. The breakout circuit 101 comprises a breakout housing 111, a breakout plug 112, a breakout cable 113, and a plurality of terminal sets 114.

The breakout housing 111 is a rigid casing. The breakout housing 111 contains the plurality of terminal sets 114. The breakout housing 111 is formed with all apertures and form factors necessary to allow the breakout housing 111 to provide access to the plurality of terminal sets 114. Methods to form a breakout housing 111 suitable for the purposes described in this disclosure are well-known and documented in the mechanical arts.

The breakout plug 112 is an electric device. The plug is defined elsewhere in this disclosure. The breakout plug 112 forms a plurality of electrical connections between the breakout circuit 101 and the ABS 103. The breakout plug 112 electrically connects to the ABS 103. Specifically, the breakout plug 112 inserts into the diagnostic port 122 of the ABS 103 to physically form the electrical connections between the breakout circuit 101 and the ABS 103. The breakout plug 112 transfers electrical signals between the breakout cable 113 of the breakout circuit 101 and the diagnostic port 122 of the ABS 103.

The breakout cable 113 is an electric cable. The cable is defined elsewhere in this disclosure. The breakout cable 113 electrically connects the breakout plug 112 to the plurality of terminal sets 114. The breakout cable 113 transfers electrical signals between the breakout plug 112 and the plurality of terminal sets 114.

Each of the plurality of terminal sets 114 attaches to the breakout housing 111 such that each of the plurality of terminal sets 114 is externally accessible. By externally accessible is meant that each of the plurality of terminal sets 114 can be electrically connected to diagnostic devices from the exterior of the breakout housing 111 of the breakout circuit 101. Each of the plurality of terminal sets 114 provides the electrically active diagnostic equipment with an electric connection to a key electric element of the ABS 103. The plurality of terminal sets 114 comprises a plurality of wheel sensor terminal sets 131, a plurality of solenoid valve terminal sets 132, and a plurality of control relay terminal sets 133.

Each of the plurality of wheel sensor terminal sets 131 is a two-lead terminal set. Each of the plurality of wheel sensor terminal sets 131 forms a direct electrical connection between the breakout circuit 101 and a wheel sensor selected from the plurality of wheel sensors 123 of the ABS 103 of the vehicle 102. The plurality of wheel sensor terminal sets 131 further comprises a first wheel sensor terminal set 141, a second wheel sensor terminal set 142, a third wheel sensor terminal set 143, and a fourth wheel sensor terminal set 144.

The first wheel sensor terminal set 141 is a terminal set selected from the plurality of wheel sensor terminal sets 131 that forms a direct electrical connection with the first wheel sensor 171 of the plurality of wheel sensors 123 of the ABS 103. The first wheel sensor terminal set 141 provides direct electrical access to the first wheel sensor 171.

The second wheel sensor terminal set 142 is a terminal set selected from the plurality of wheel sensor terminal sets 131 that forms a direct electrical connection with the second wheel sensor 172 of the plurality of wheel sensors 123 of the ABS 103. The second wheel sensor terminal set 142 provides direct electrical access to the second wheel sensor 172.

The third wheel sensor terminal set 143 is a terminal set selected from the plurality of wheel sensor terminal sets 131 that forms a direct electrical connection with the third wheel sensor 173 of the plurality of wheel sensors 123 of the ABS 103. The third wheel sensor terminal set 143 provides direct electrical access to the third wheel sensor 173.

The fourth wheel sensor terminal set 144 is a terminal set selected from the plurality of wheel sensor terminal sets 131 that forms a direct electrical connection with the fourth wheel sensor 174 of the plurality of wheel sensors 123 of the ABS 103. The fourth wheel sensor terminal set 144 provides direct electrical access to the fourth wheel sensor 174.

Each of the plurality of solenoid valve terminal sets 132 is a two-lead terminal set. Each of the plurality of solenoid valve terminal sets 132 forms a direct electrical connection between the breakout circuit 101 and a solenoid valve selected from the plurality of solenoid valves 124 of the ABS 103 of the vehicle 102. The plurality of solenoid valve terminal sets 132 further comprises a first solenoid valve terminal set 151, a second solenoid valve terminal set 152, a third solenoid valve terminal set 153, and a fourth solenoid valve terminal set 154.

The first solenoid valve terminal set 151 is a terminal set selected from the plurality of solenoid valve terminal sets 132 that forms a direct electrical connection with the first solenoid valve 181 of the plurality of solenoid valves 124 of the ABS 103. The first solenoid valve terminal set 151 provides direct electrical access to the first solenoid valve 181.

The second solenoid valve terminal set 152 is a terminal set selected from the plurality of solenoid valve terminal sets 132 that forms a direct electrical connection with the second solenoid valve 182 of the plurality of solenoid valves 124 of the ABS 103. The second solenoid valve terminal set 152 provides direct electrical access to the second solenoid valve 182.

The third solenoid valve terminal set 153 is a terminal set selected from the plurality of solenoid valve terminal sets 132 that forms a direct electrical connection with the third solenoid valve 183 of the plurality of solenoid valves 124 of the ABS 103. The third solenoid valve terminal set 153 provides direct electrical access to the third solenoid valve 183.

The fourth solenoid valve terminal set 154 is a terminal set selected from the plurality of solenoid valve terminal sets 132 that forms a direct electrical connection with the fourth solenoid valve 184 of the plurality of solenoid valves 124 of the ABS 103. The fourth solenoid valve terminal set 154 provides direct electrical access to the fourth solenoid valve 184.

Each of the plurality of control relay terminal sets 133 is a two-lead terminal set. Each of the plurality of control relay terminal sets 133 forms a direct electrical connection between the breakout circuit 101 and a relay selected from the plurality of control relays 125 of the ABS 103 of the vehicle 102. The plurality of control relay terminal sets 133 further comprises a first control relay terminal set 161, a second control relay terminal set 162, and a third control relay terminal set 163.

The first control relay terminal set 161 is a terminal set selected from the plurality of control relay terminal sets 133 that forms a direct electrical connection with the first control relay 191 of the plurality of control relays 125 of the ABS 103. The first control relay terminal set 161 provides direct electrical access to the first control relay 191.

The second control relay terminal set 162 is a terminal set selected from the plurality of control relay terminal sets 133 that forms a direct electrical connection with the second control relay 192 of the plurality of control relays 125 of the ABS 103. The second control relay terminal set 162 provides direct electrical access to the second control relay 192.

The third control relay terminal set 163 is a terminal set selected from the plurality of control relay terminal sets 133 that forms a direct electrical connection with the third control relay 193 of the plurality of control relays 125 of the ABS 103. The third control relay terminal set 163 provides direct electrical access to the third control relay 193.

The following definitions were used in this disclosure:

ABS: As used in this disclosure, an ABS is a braking system configured for use with a vehicle. ABS is an acronym for anti-skid braking system. The ABS is a feedback based system that: a) measures the speed of rotation of each of the wheel of the vehicle that has a braking mechanism (referred to as a braked wheel); and, b) adjusts the pressure of the hydraulic fluid to the brake mechanism of each braked wheel such that each braked wheel rotates during a braking event.

Brake: As used in this disclosure, a brake is a device that is used to slow or stop the motion of a machine or a vehicle.

Cable: As used in this disclosure, a cable is a collection of one or more insulated wires covered by a protective casing that is used for transmitting electricity or telecommunication signals.

Feedback: As used in this disclosure, feedback refers to a system, including engineered systems, or a subsystem further comprising an "input" and an "output" wherein the difference between the output of the engineered system or subsystem and a reference is used as, or fed back into, a portion of the input of the system or subsystem. Examples of feedback in engineered systems include, but are not limited to, a fluid level control device such as those typically used in a toilet tank, a cruise control in an automobile, a fly ball governor, a thermostat, and almost any electronic device that comprises an amplifier. Feedback systems in nature include, but are not limited to, thermal regulation in animals and blood clotting in animals (wherein the platelets involved in blood clotting release chemical to attract other platelets).

Fluid: As used in this disclosure, a fluid refers to a state of matter wherein the matter is capable of flow and takes the shape of a container it is placed within. The term fluid commonly refers to a liquid or a gas.

Housing: As used in this disclosure, a housing is a rigid structure that encloses and protects one or more devices.

Hydraulic: As used in this disclosure, hydraulic refers to a device wherein the movement of the device is powered using a fluid under pressure.

Interface: As used in this disclosure, an interface is a physical or virtual boundary that separates two different systems across which information is exchanged.

Lead: As used in this disclosure, a lead is a conductor that is physically used to electrically connect an electrical component into a larger circuit assembly.

Multi-Meter: As used in this disclosure, a multi-meter refers to a measurement device configured for use with an electric circuit. A multi-meter is configured to measure: a) the voltage between (across) two point in an electric circuit; b) the electric current flowing through a point in the electric circuit; and, c) the resistance or impedance presented by the electric circuit or a circuit element within the electric circuit. The multi-meter is configured for use with both AC electric circuits and DC electric circuits. A multi-meter will generally measure RMS values for AC electric circuits. The multi-meter electrically connects to the electric circuit with a first lead and a second lead. A multi-meter that is configured to measure only voltage is referred to as a voltmeter. A multi-meter that is configured to measure only electric current is referred to as an ammeter.

Plug: As used in this disclosure, a plug is an electrical termination that electrically connects a first electrical circuit to a second electrical circuit or a source of electricity. As used in this disclosure, a plug will have two or three metal pins.

Port: As used in this disclosure, a port is an electrical termination that is used to connect a first electrical circuit to a second external electrical circuit. In this disclosure, the port is designed to receive a plug.

Relay: As used in this disclosure, a relay is an automatic electromagnetic or electromechanical device that reacts to changes in voltage or current by opening or closing a switch in an electric circuit. Relays further defined with a coil and a switch. Applying a voltage to the coil, usually referred to as energizing the coil, will cause the coil to change the position of the switch. Note: Though transistors can be configured to perform switching functions, transistors used for switching functions are handled separately in this disclosure and are explicitly excluded from this definition.

Rigid Structure: As used in this disclosure, a rigid structure is a solid structure formed from an inelastic material that resists changes in shape. A rigid structure will permanently deform as it fails under a force.

Sensor: As used in this disclosure, a sensor is a device that receives and responds in a predetermined way to a signal or stimulus. As further used in this disclosure, a threshold sensor is a sensor that generates a signal that indicates whether the signal or stimulus is above or below a given threshold for the signal or stimulus.

Solenoid: As used in this disclosure, a solenoid is a cylindrical coil of electrical wire that generates a magnetic field that can be used to mechanically move a shaft made of a magnetic core.

Solenoid Valve: As used in this disclosure, a solenoid valve is an electromechanically controlled valve that is used to control fluid or gas flow. A two port solenoid valve opens or closes to fluid flow through the valve portion of the solenoid valve. A three port solenoid valve switched fluid or gas flow between a first port and a second port to either feed or be fed from a third port. A solenoid valve comprises a coil and a valve. The coil forms the solenoid that opens and closes the solenoid valve. The solenoid valve is a valve that opens and closes to control the fluid flow.

Terminal: As used in this disclosure, a terminal is the end point of a conductor. A terminal can be the conducting wire itself or may have attached to is a device designed to facilitate an electrical connection. The terminal is also called a termination.

Vehicle: As used in this disclosure, a vehicle is a device that is used for transporting passengers, goods, or equipment. The term motorized vehicle specifically refers to a vehicle can move under power provided by an electric motor or an internal combustion engine. The term vehicle generically applies to motorized vehicles and vehicles without a motor.

Wheel: As used in this disclosure, a wheel is a circular object that revolves around an axle or an axis and is fixed below an object to enable it to move easily over the ground. For the purpose of this disclosure, it is assumed that a wheel can only revolve in a forward and a backward direction. Wheels are often further defined with a rim and spokes. Spokes are also commonly referred to as a wheel disk.

With respect to the above description, it is to be realized that the optimum dimensional relationship for the various components of the invention described above and in FIGS. 1 through 4 include variations in size, materials, shape, form, function, and manner of operation, assembly and use, are deemed readily apparent and obvious to one skilled in the art, and all equivalent relationships to those illustrated in the drawings and described in the specification are intended to be encompassed by the invention.

It shall be noted that those skilled in the art will readily recognize numerous adaptations and modifications which can be made to the various embodiments of the present invention which will result in an improved invention, yet all of which will fall within the spirit and scope of the present invention as defined in the following claims. Accordingly, the invention is to be limited only by the scope of the following claims and their equivalents.

What is claimed is:

1. An ABS diagnostic tool comprising
a breakout circuit;
wherein the breakout circuit is configured to plug into a vehicle;

wherein the ABS diagnostic tool is an electrical apparatus;
wherein the ABS diagnostic tool is configured for use with the vehicle;
wherein the vehicle further comprises on or more braked wheels;
wherein the vehicle further comprises an anti-skid braking system (ABS);
wherein the ABS diagnostic tool is an interface device that electrically connects to the ABS;
wherein the breakout circuit plugs into the ABS;
wherein the breakout circuit comprises a breakout housing, a breakout plug, a breakout cable, and a plurality of terminal sets;
wherein the breakout housing is a rigid casing;
wherein the breakout housing contains the plurality of terminal sets;
wherein the breakout cable transfers electrical signals between the breakout plug and the plurality of terminal sets;
wherein the breakout plug is an electric device;
wherein the breakout plug forms a plurality of electrical connections between the breakout circuit and the ABS;
wherein the breakout plug electrically connects to the ABS;
wherein the breakout plug inserts into the diagnostic port of the ABS to physically form the electrical connections between the breakout circuit and the ABS;
wherein the breakout plug transfers electrical signals between the breakout cable of the breakout circuit and the diagnostic port of the ABS.

2. The ABS diagnostic tool according to claim 1
wherein the ABS is the braking system of the vehicle;
wherein the ABS is an electromechanical device;
wherein the ABS measures the speed of rotation of each braked wheel of the vehicle;
wherein the ABS is a feedback device that adjusts the pressure of the hydraulic fluid applied to each braking element of the ABS based on the speed of rotation of each braked wheel.

3. The ABS diagnostic tool according to claim 2
wherein the breakout circuit is an electrical circuit;
wherein the breakout circuit electrically connects to the ABS;
wherein the ABS electrically connects the breakout circuit to the ABS such that the breakout circuit provides electrical connections for tools used to diagnose electrical maintenance issues;
wherein the breakout circuit physically presents these electrical connections through a plurality of terminal sets.

4. The ABS diagnostic tool according to claim 3
wherein the breakout plug inserts into the diagnostic port of the ABS to physically form the electrical connections between the breakout circuit and the ABS;
wherein the diagnostic port transfers electrical signals between the breakout plug of the breakout circuit and the plurality of wheel sensors, the plurality of solenoid valves, and the plurality of control relays of the ABS.

5. The ABS diagnostic tool according to claim 4
wherein the diagnostic port is an electric device;
wherein the diagnostic port electrically connects to the breakout plug of the breakout circuit to the ABS;
wherein the breakout circuit inserts into the diagnostic port of the ABS to physically form the electrical connections between the breakout circuit and the ABS;
wherein the diagnostic port transfers electrical signals between the breakout circuit and the plurality of wheel sensors, the plurality of solenoid valves, and the plurality of control relays of the ABS.

6. The ABS diagnostic tool according to claim 5
wherein each of the plurality of wheel sensors electrically connects to the control circuit of the ABS such that the electrical signals generated by the plurality of wheel sensors provide the feedback necessary for the ABS to the appropriately adjust the plurality of solenoid valves to provide the appropriate hydraulic fluid pressure to each braked wheel of the ABS during the braking process.

7. The ABS diagnostic tool according to claim 6
wherein each of the plurality of solenoid valves is an electrically controlled valve;
wherein each solenoid valve selected from the plurality of solenoid valves controls the hydraulic fluid pressure that is provided to the braking element of a braked wheel associated with the selected solenoid valve;
wherein the control circuit of the ABS electrically controls the operation of each of the plurality of solenoid valves;
wherein each of the plurality of solenoid valves controls the hydraulic fluid pressure applied by the ABS to a selected braked wheel of the vehicle;
wherein each solenoid valve selected from the plurality of solenoid valves electrically connects to the control circuitry of the ABS such that the electrical signals generated by the ABS indicate to the selected solenoid valve the operational setting required to provide the appropriate hydraulic fluid pressure to the brake wheel supported by the selected solenoid valve.

8. The ABS diagnostic tool according to claim 7
wherein each of the plurality of control relays is an electrically controlled switch;
wherein each relay selected from the plurality of control relays transmits a control signal used by the control circuit of the ABS to control the braking operation and performance of the ABS.

9. The ABS diagnostic tool according to claim 8
wherein the breakout cable is an electric cable;
wherein the breakout cable electrically connects the breakout plug to the plurality of terminal sets.

10. The ABS diagnostic tool according to claim 9
wherein each of the plurality of terminal sets attaches to the breakout housing such that each of the plurality of terminal sets is externally accessible;
wherein by externally accessible is meant that each of the plurality of terminal sets electrically connects to diagnostic devices from the exterior of the breakout housing of the breakout circuit;
wherein each of the plurality of terminal sets provides the electrically active diagnostic equipment with an electric connection to a key electric element of the ABS.

11. The ABS diagnostic tool according to claim 10
wherein the plurality of terminal sets comprises a plurality of wheel sensor terminal sets, a plurality of solenoid valve terminal sets, and a plurality of control relay terminal sets;
wherein each of the plurality of wheel sensor terminal sets is a two-lead terminal set;
wherein each of the plurality of wheel sensor terminal sets forms a direct electrical connection between the breakout circuit and a wheel sensor selected from the plurality of wheel sensors of the ABS of the vehicle;
wherein each of the plurality of solenoid valve terminal sets is a two-lead terminal set;

wherein each of the plurality of solenoid valve terminal sets forms a direct electrical connection between the breakout circuit and a solenoid valve selected from the plurality of solenoid valves of the ABS of the vehicle;

wherein each of the plurality of control relay terminal sets is a two-lead terminal set;

wherein each of the plurality of control relay terminal sets forms a direct electrical connection between the breakout circuit and a relay selected from the plurality of control relays of the ABS of the vehicle;

wherein the plurality of control relay terminal sets further comprises a first control relay terminal set, a second control relay terminal set, and a third control relay terminal set.

12. The ABS diagnostic tool according to claim 11 wherein the plurality of wheel sensors comprises a first wheel sensor, a second wheel sensor, a third wheel sensor, and a fourth wheel sensor;

wherein the first wheel sensor is a sensor used to measure the speed of rotation of a first braked wheel of the vehicle;

wherein the first wheel sensor is monitored by the control circuit of the ABS;

wherein the second wheel sensor is a sensor used to measure the speed of rotation of a second braked wheel of the vehicle;

wherein the second wheel sensor is monitored by the control circuit of the ABS;

wherein the third wheel sensor is a sensor used to measure the speed of rotation of a third braked wheel of the vehicle;

wherein the third wheel sensor is monitored by the control circuit of the ABS;

wherein the fourth wheel sensor is a sensor used to measure the speed of rotation of a fourth braked wheel of the vehicle;

wherein the fourth wheel sensor is monitored by the control circuit of the ABS.

13. The ABS diagnostic tool according to claim 12 wherein the plurality of wheel sensor terminal sets further comprises a first wheel sensor terminal set, a second wheel sensor terminal set, a third wheel sensor terminal set, and a fourth wheel sensor terminal set;

wherein the first wheel sensor terminal set is a terminal set selected from the plurality of wheel sensor terminal sets that forms a direct electrical connection with the first wheel sensor of the plurality of wheel sensors of the ABS;

wherein the first wheel sensor terminal set provides direct electrical access to the first wheel sensor;

wherein the second wheel sensor terminal set is a terminal set selected from the plurality of wheel sensor terminal sets that forms a direct electrical connection with the second wheel sensor of the plurality of wheel sensors of the ABS;

wherein the second wheel sensor terminal set provides direct electrical access to the second wheel sensor;

wherein the third wheel sensor terminal set is a terminal set selected from the plurality of wheel sensor terminal sets that forms a direct electrical connection with the third wheel sensor of the plurality of wheel sensors of the ABS;

wherein the third wheel sensor terminal set provides direct electrical access to the third wheel sensor;

wherein the fourth wheel sensor terminal set is a terminal set selected from the plurality of wheel sensor terminal sets that forms a direct electrical connection with the fourth wheel sensor of the plurality of wheel sensors of the ABS;

wherein the fourth wheel sensor terminal set provides direct electrical access to the fourth wheel sensor.

14. The ABS diagnostic tool according to claim 13 wherein the plurality of solenoid valves comprises a first solenoid valve, a second solenoid valve, a third solenoid valve, and a fourth solenoid valve;

wherein the first solenoid valve is a solenoid valve that controls the hydraulic fluid pressure provided to the braking element of a first braked wheel of the vehicle;

wherein the first solenoid valve is controlled using the control circuit of the ABS;

wherein the second solenoid valve is a solenoid valve that controls the hydraulic fluid pressure provided to the braking element of a second braked wheel of the vehicle;

wherein the second solenoid valve is controlled using the control circuit of the ABS;

wherein the third solenoid valve is a solenoid valve that controls the hydraulic fluid pressure provided to the braking element of a third braked wheel of the vehicle;

wherein the third solenoid valve is controlled using the control circuit of the ABS;

wherein the fourth solenoid valve is a solenoid valve that controls the hydraulic fluid pressure provided to the braking element of a fourth braked wheel of the vehicle;

wherein the fourth solenoid valve is controlled using the control circuit of the ABS.

15. The ABS diagnostic tool according to claim 14 wherein the plurality of solenoid valve terminal sets further comprises a first solenoid valve terminal set, a second solenoid valve terminal set, a third solenoid valve terminal set, and a fourth solenoid valve terminal set;

wherein the first solenoid valve terminal set is a terminal set selected from the plurality of solenoid valve terminal sets that forms a direct electrical connection with the first solenoid valve of the plurality of solenoid valves of the ABS;

wherein the first solenoid valve terminal set provides direct electrical access to the first solenoid valve;

wherein the second solenoid valve terminal set is a terminal set selected from the plurality of solenoid valve terminal sets that forms a direct electrical connection with the second solenoid valve of the plurality of solenoid valves of the ABS;

wherein the second solenoid valve terminal set provides direct electrical access to the second solenoid valve;

wherein the third solenoid valve terminal set is a terminal set selected from the plurality of solenoid valve terminal sets that forms a direct electrical connection with the third solenoid valve of the plurality of solenoid valves of the ABS;

wherein the third solenoid valve terminal set provides direct electrical access to the third solenoid valve;

wherein the fourth solenoid valve terminal set is a terminal set selected from the plurality of solenoid valve terminal sets that forms a direct electrical connection with the fourth solenoid valve of the plurality of solenoid valves of the ABS;

wherein the fourth solenoid valve terminal set provides direct electrical access to the fourth solenoid valve.

16. The ABS diagnostic tool according to claim 15
wherein the plurality of control relays comprises a first control relay, a second control relay, and a third control relay;
wherein the first control relay is a relay that controls the flow of electricity through the control circuit of the ABS;
wherein the control circuit of the ABS controls a portion of the operation of the ABS using the first control relay;
wherein the second control relay is a relay that controls the flow of electricity through the control circuit of the ABS;
wherein the control circuit of the ABS controls a portion of the operation of the ABS using the second control relay;
wherein the third control relay is a relay that controls the flow of electricity through the control circuit of the ABS;
wherein the control circuit of the ABS controls a portion of the operation of the ABS using the third control relay.

17. The ABS diagnostic tool according to claim 16
wherein the first control relay terminal set is a terminal set selected from the plurality of control relay terminal sets that forms a direct electrical connection with the first control relay of the plurality of control relays of the ABS;
wherein the first control relay terminal set provides direct electrical access to the first control relay;
wherein the second control relay terminal set is a terminal set selected from the plurality of control relay terminal sets that forms a direct electrical connection with the second control relay of the plurality of control relays of the ABS;
wherein the second control relay terminal set provides direct electrical access to the second control relay;
wherein the third control relay terminal set is a terminal set selected from the plurality of control relay terminal sets that forms a direct electrical connection with the third control relay of the plurality of control relays of the ABS;
wherein the third control relay terminal set provides direct electrical access to the third control relay.

\* \* \* \* \*